United States Patent
Ouyang

(10) Patent No.: US 7,362,575 B2
(45) Date of Patent: Apr. 22, 2008

(54) COOLING METHOD USE DIAMOND PINS AND HEAT PIPES

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 101 days.

(21) Appl. No.: 11/487,771

(22) Filed: Jul. 17, 2006

(65) Prior Publication Data
US 2008/0013281 A1 Jan. 17, 2008

(51) Int. Cl.
*H05K 7/20* (2006.01)

(52) U.S. Cl. .............. 361/703; 361/698; 361/701; 361/710; 165/80.2; 165/80.4; 165/104.21; 165/104.26; 165/104.33; 257/718; 257/727; 62/259.2

(58) Field of Classification Search .......... 361/698, 361/699, 700, 701, 702, 703, 709–712, 715, 361/719; 257/718, 727; 62/259.2; 165/80.2, 165/80.3, 80.4, 104.21, 104.26, 104.33
See application file for complete search history.

(56) References Cited

U.S. PATENT DOCUMENTS

| 4,226,281 | A | * | 10/1980 | Chu | .................... | 165/80.2 |
|---|---|---|---|---|---|---|
| 4,546,405 | A | * | 10/1985 | Hultmark et al. | ........... | 361/718 |
| 6,223,815 | B1 | * | 5/2001 | Shibasaki | ................... | 165/185 |
| 6,246,583 | B1 | * | 6/2001 | Cronin et al. | ................ | 361/704 |
| 6,867,976 | B2 | * | 3/2005 | Belady et al. | ............... | 361/704 |
| 7,206,203 | B2 | * | 4/2007 | Campbell et al. | ........... | 361/699 |
| 2007/0144182 | A1 | * | 6/2007 | Sauciuc et al. | ............... | 62/3.2 |

\* cited by examiner

*Primary Examiner*—Michael Datskovskiy
(74) *Attorney, Agent, or Firm*—Osha•Liang LLP

(57) ABSTRACT

An apparatus for cooling a microprocessor includes a first thermal interface material layer; a lid that encases the first thermal interface material layer and the microprocessor; a second thermal interface material layer applied to a top of the lid; at least one configurable diamond pin; at least one heat pipe; and a heat sink structure. At least one diamond pin is configured to displace junction temperature on a hot spot location of the microprocessor. The heat sink structure and at least one heat pipe are configured atop the second thermal interface material layer. In a method of cooling a microprocessor including a first thermal interface material layer; a lid that encases the first thermal interface material layer and the microprocessor; a second thermal interface material layer applied to a top of the lid, the method includes disposing at least one configurable diamond pin at a hot spot location of the microprocessor; and configuring a heat sink structure and at least one heat pipe atop the second thermal interface material layer.

10 Claims, 4 Drawing Sheets

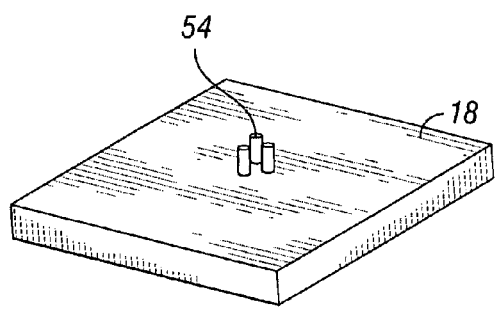
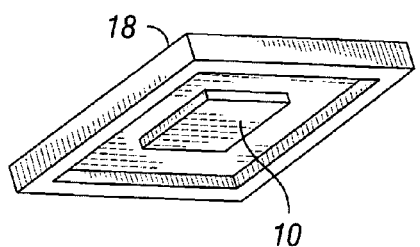
FIG. 5A	FIG. 5B
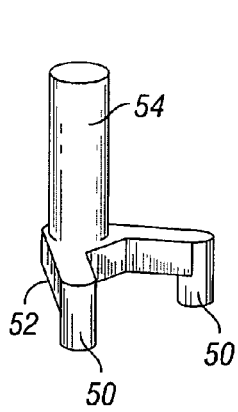
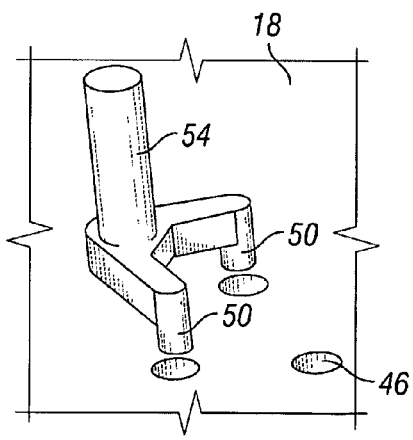
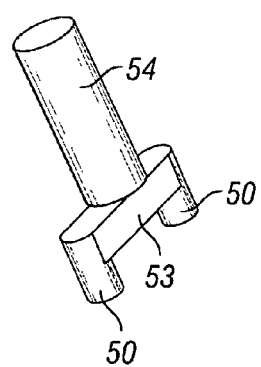
FIG. 6A	FIG. 6B	FIG. 6C

COOLING METHOD USE DIAMOND PINS AND HEAT PIPES

BACKGROUND OF INVENTION

As microprocessor technology continues to evolve, the corresponding scale size of computer chips continues to shrink. Silicon based transistors are being manufactured smaller and smaller, however this meets the problem of increased power dissipation, especially power dissipated in the form of heat. Historically, to counter this problem, microprocessor heat is transferred and distributed using fans and heat sink structures.

Traditionally, the current approach for cooling is to conduct heat away from a silicon microprocessor as a whole. FIG. 1 displays a heat sink attached to a microprocessor. A silicon microprocessor (10) is fixed between a substrate layer (12) and a first thermal interface material (TIM) layer (14). A lid (18) encases the silicon microprocessor (10), abutting the first TIM layer (14), and fixed to the top of the substrate layer (12). Fixed to the top of the lid is a second TIM layer (16). Fixed above the second TIM layer (16) is a heat sink structure (20) comprising a plurality of fins configured with a large surface area to distribute heat. As heat is dissipated from the silicon microprocessor, the first (14) and second (16) TIM layers and lid (18), which are made of materials chosen for their high thermal conductivity, transfer the heat to the heat sink structure (20).

Thermal interface material (TIM) is typically placed between microprocessors and heat sinks to increase thermal transfer between the two devices. The microprocessor and heat sink device are solid and, in practice, tend not to have a perfectly flat ideal surface. When abutting the heat sink device directly to the lid or microprocessor, there will likely be air gaps due to portions where the surfaces are not flat and smooth. A TIM layer is placed between the microprocessor and the heat sink to fill in these air gaps. This allows for much higher thermal heat transfer.

The TIM layer can take on many forms, the most common perhaps, is known as "thermal grease." Thermal grease is typically silicone oil filled with aluminum oxide, zinc oxide, or boron nitride. Alternatively, pulverized silver may be used. A grease or oil-like substance provides a good interface between the two solid objects; air gaps are filled and high heat transfer can be achieved.

An additional type of thermal interface material is known as phase change material. At room temperature, these are solid materials, however, they behave as a grease-like substance at the processor's hotter operating temperatures.

Heat pipes are well known for numerous cooling applications from CPUs to nuclear power cells. See, for example, U.S. Pat. No. 6,889,755. Heat pipes employ a technique known as evaporative cooling. Referring to FIG. 2, a heat pipe (36) comprises a vacuum tight envelope (30), a wick structure (34), and a working fluid (32). Typically, the heat pipe is evacuated and then filled with a small amount of working fluid (32), just enough to saturate the wick (34). In practice, the wick (34) is often made of a porous material and configured to line the internal wall of the heat pipe (36). An equilibrium of liquid and vapor sets the atmosphere inside the heat pipe. The equilibrium is upset as heat enters the evaporator end (35), generating vapor at a slightly higher pressure. This higher pressure vapor travels up to the condenser end (37). Due to slightly lower temperatures at the condenser end (37), the vapor condenses, giving up its latent heat of vaporization. The condensed fluid is then drawn back to the evaporator end (35) by the capillary forces developed in the wick structure (34). Heat pipes, over other conducting structures, transfer heat from the evaporator end to the condenser end very well.

Another cooling technique uses diamond material to conduct heat away from silicon microprocessors. Diamond has been known as a good conductor of heat because of the strong covalent bonding within the crystal. Most natural blue diamonds contain boron atoms which replace carbon atoms in the crystal matrix, and also have high thermal conductivity. Because diamond has such high thermal conductance, it is used in semiconductor manufacture to prevent silicon and other semiconductor materials from overheating. Diamond conductors can be manufactured synthetically, however, they are rather expensive.

SUMMARY OF INVENTION

In accordance with one or more embodiments, an apparatus for cooling a microprocessor comprises a first thermal interface material layer; a lid that encases the first thermal interface material layer and the microprocessor; a second thermal interface material layer applied to a top of the lid; at least one configurable diamond pin; at least one heat pipe; and a heat sink structure; wherein at least one diamond pin is configured to displace junction temperature on a hot spot location of the microprocessor; and wherein the heat sink structure and at least one heat pipe are configured atop the second thermal interface material layer.

In accordance with one or more embodiments, a method of cooling a microprocessor comprising a first thermal interface material layer; a lid that encases the first thermal interface material layer and the microprocessor; a second thermal interface material layer applied to a top of the lid, the method comprises disposing at least one configurable diamond pin at a hot spot location of the microprocessor; and configuring a heat sink structure and at least one heat pipe atop the second thermal interface material layer.

Other aspects and advantages of the invention will be apparent from the following description and the appended claims.

BRIEF DESCRIPTION OF DRAWINGS

FIG. 5a illustrates several diamond pins centrally inserted into a lid.

FIG. 5b illustrates the underside of FIG. 5a, displaying a lid and silicon microprocessor.

FIG. 6a illustrates one embodiment of a configurable diamond pin.

FIG. 6b illustrates the embodiment of a configurable diamond pin in FIG. 5a placed over drilled holes in a lid.

FIG. 6c illustrates a second embodiment of a configurable diamond pin.

DETAILED DESCRIPTION

Figure 1:
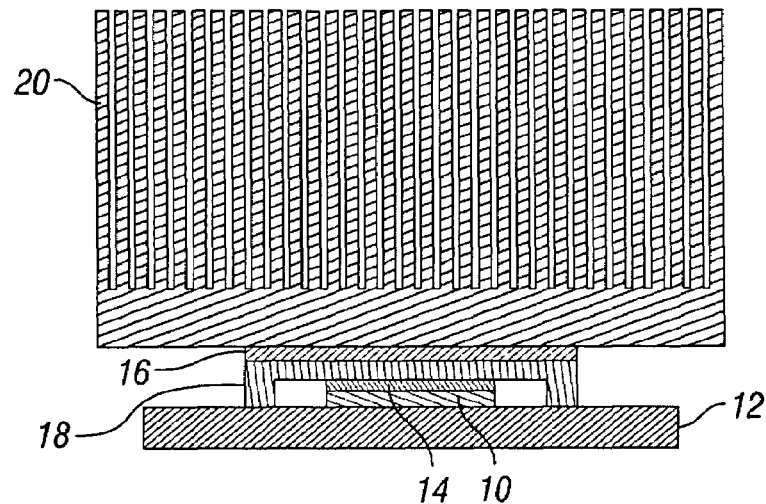
FIG. 1 illustrates a traditional heat sink structure for cooling a silicon microprocessor.
Figure 2:
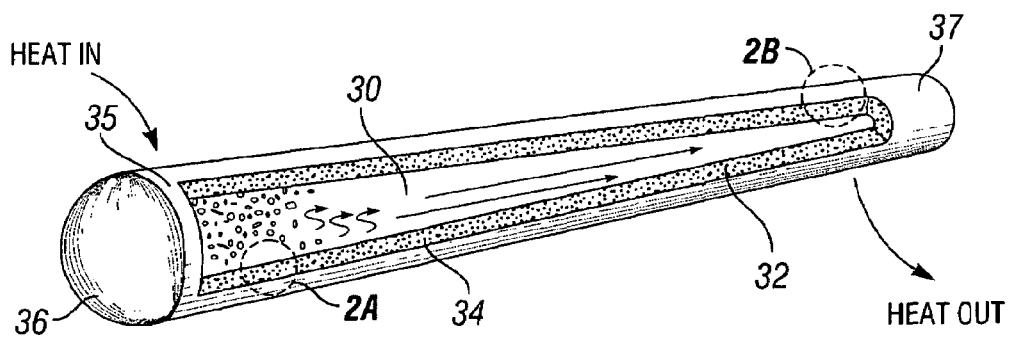
FIG. 2 illustrates a traditional heat pipe.
Figure 2A:
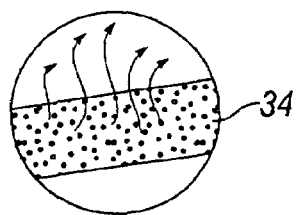
FIG. 2a illustrates vapor exiting a wick structure.
Figure 2B:
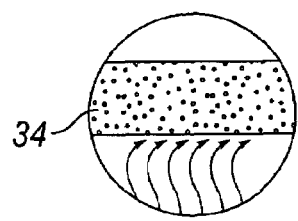
FIG. 2b illustrates vapor condensing onto a wick structure.
Figure 3:
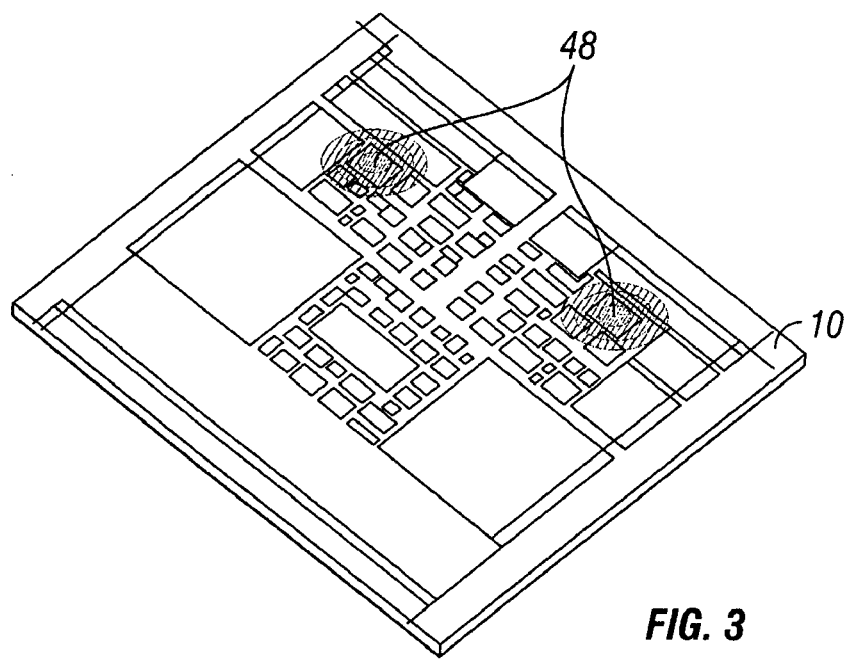
FIG. 3 illustrates a silicon microprocessor with contrasts to show junction temperature hot spot locations.

Embodiments of the present invention will be explained in detail below with reference to the figures. Like elements are denoted by like reference numbers throughout the figures. FIG. 3 shows a thermal image of a silicon microprocessor. The contrasts in color represent junction temperature hot spot locations. One or more embodiments of the present invention directly address cooling of these specific hot spots in order to ensure that the microprocessor remains at a functional temperature.

Within a single silicon microprocessor chip, there are many high power compact circuit blocks, with different power levels depending on their application. The "junction temperature" is defined as the highest temperature on the silicon microprocessor chip, and is generally located at the position where many high power circuit blocks meet. FIG. 3 shows that as a consequence of internal circuit design, junction temperature hot spots (48) are sporadically displaced about an exemplary silicon microprocessor (10). Placing high conducting diamond pins over junction temperature hot spot locations or over other junctions of high thermal activity significantly cools these locations, lowers the overall temperature of the chip, and insures functionality of the microprocessor.

In one or more embodiments, the two aforementioned cooling methodologies, i.e., cooling with diamond material and cooling with heat pipes, are employed to lower temperatures on a silicon microprocessor. Furthermore, these two cooling methods may be combined with a heat sink structure to cool silicon microprocessors.

Figure 4:
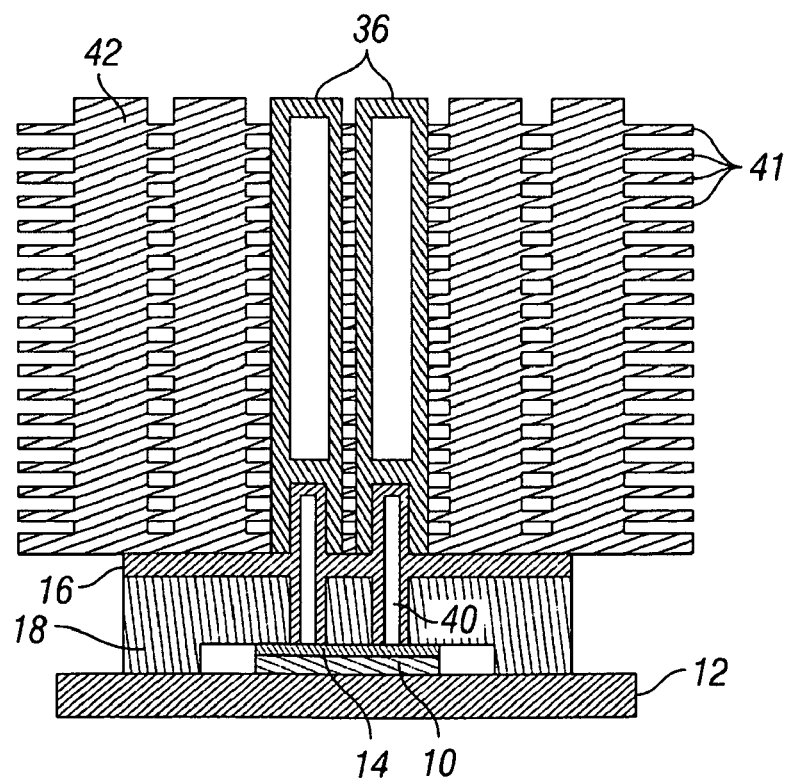
FIG. 4 illustrates a cross section in accordance with one embodiment of the present invention.

In one embodiment, as shown in FIG. 4, an apparatus for cooling a silicon microprocessor comprises a first (14) and second (16) thermal interface material (TIM) layer, one or more diamond pins (40), one or more heat pipes (36), a heat sink structure (42), and a lid (18), wherein said apparatus is configured to displace heat from junction temperature on hot spots of said microprocessor. Diamond pins (40) abutting the silicon microprocessor (10) provide an advantage of conducting heat away from junction temperature hot spot locations on the microprocessor (10) and up to heat pipes (36).

A silicon microprocessor (10) is fixed between a substrate layer (12) and a first thermal interface material (TIM) layer (14). A lid (18) encases the silicon microprocessor (10), abutting the first TIM layer (14), and fixed to the top of the substrate layer (12). Applied to the top of the lid is a second TIM layer (16). One or more configurable diamond pins (40), here configured as straight pin-like structures, traverse the second TIM layer (16) and holes drilled through the lid (18). The bottom ends of the diamond pins (40) abut the first TIM layer (14). The top ends of the diamond pins (40) are fixed to base of the heat pipes (36). The heat pipes (36) are centrally located, surrounded by and connected to a heat sink structure (42). In the embodiment shown, two heat pipes and two diamond pins are centrally located. However, one skilled in the art will appreciate that the number of heat pipes or diamond pins used and the locations of the heat pipes or diamond pins may be configured differently based on the layout of, and accordingly hot spots of, the silicon microprocessor.

The lid (18) covers the microprocessor to provide protection and ensure reliability. However the lid (18) inhibits heat from transferring out. In the prior art, heat transfers from the silicon microprocessor (10) to the first TIM layer (14) to the lid (18) to the second TIM layer (16), and then to the heat sink fins (20). In one or more embodiments, heat still transfers in this manner, however, additionally heat travels more so from the silicon microprocessor (10) to the first TIM layer (14) to diamond pins (40) to heat pipes (36), and then to the heat sink structure (42). Connecting the diamond pins (40) to the base of the heat pipes (36), and connecting the heat pipes (36) securely to the heat sink structure (42) ensures an even and high heat transfer from junction temperature hot spots on the silicon microprocessor. From the heat sink structure the heat is dispersed through the large surface area provided by a plurality of heat sink fins (41). One skilled in the art will appreciate that, in one or more embodiments, diamond pins abut areas of less critical temperatures on the silicon microprocessor, or that diamond pins may transfer heat directly to a heat sink structure, bypassing heat pipes.

Diamond pins are rather expensive due to their high conductivity and other physical properties, thus, in one or more embodiments, the use of diamond pins is preferably used to conduct heat away from critical hot spots on the silicon microprocessor that dissipate junction temperatures. The locations of the junction temperature hot spots may vary on the microprocessor chip, so in order to maintain flexibility, the diamond pins can be configured in shape to abut hot spots while still fixed to the preferably centrally located heat pipes.

FIG. 6 displays a plurality of configurable diamond pins. In one or more embodiments, a configurable diamond pin comprises a shaft (54), a base, and at least one conduit (50). Additionally, a single diamond pin structure can have multiple conduits (50) that branch off from said base to traverse the lid and abut the first TIM layer. The base of the diamond pin can take on a variety of shapes to provide flexibility for cooling different types of silicon microprocessors. In the embodiments shown in FIGS. 6a and 6c, diamond pins take on shapes having a straight base (53) and a V-shaped base (52) respectively. The shape of the base is not limited to those shown. One skilled in the art will appreciate that other shapes may be employed given the hot spot locations on the silicon microprocessor. Similarly, one skilled in the art will appreciate that diamond pins in which the shaft or conduits are not straight in shape, but rather are complex in shape to conform to a particular specification, may be used.

Further, FIG. 5a displays the shaft (54) of the configurable diamond pins protruding from a central region of the lid (18). An underside view on FIG. 5b illustrates the silicon microprocessor (10) beneath the lid (18). In one or more embodiments, illustrated in FIG. 6b, the V-shaped configurable diamond pin is arranged above drilled holes (46) in the lid (18). Referring to FIG. 5a, the configurable diamond pins allow the shafts of the pins to be preferably centrally located on the lid (18) while the conduits abut the junction temperature hot spot locations or other locations of high thermal activity.

Figure 7:
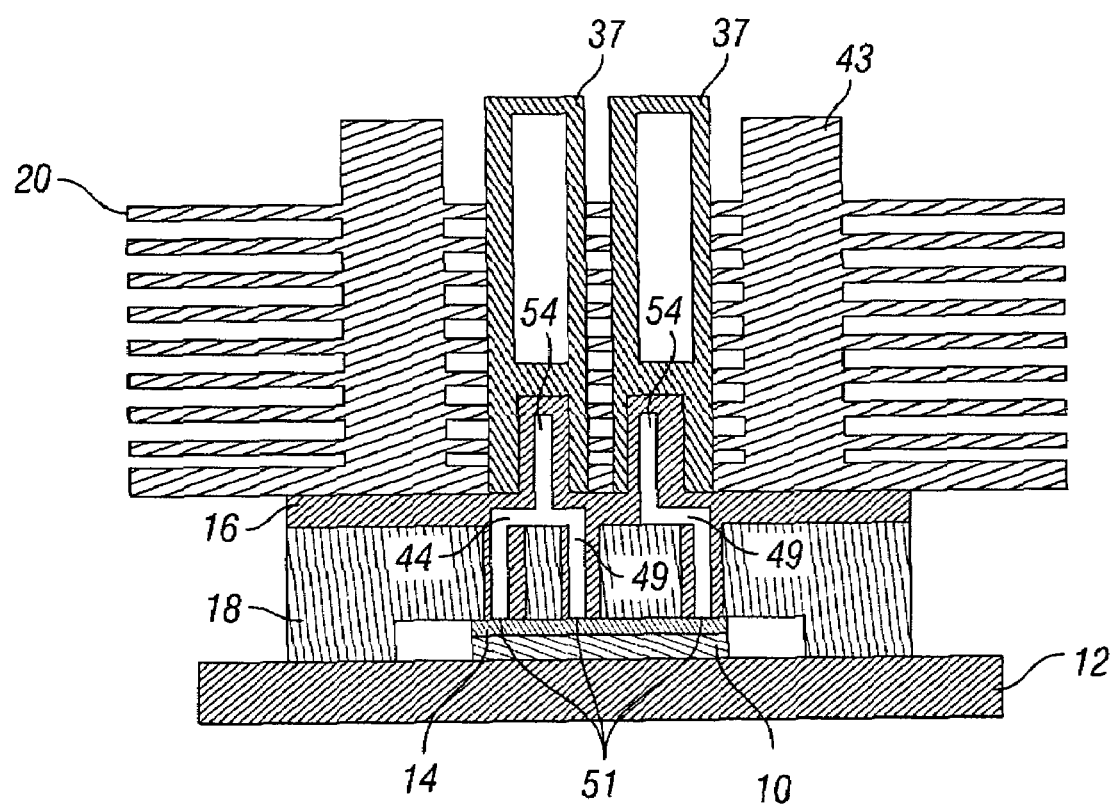
FIG. 7 illustrates another embodiment of the present invention.

In the embodiments illustrated in FIG. 7, configurable diamond pins are employed in a cooling apparatus. FIG. 7 is similar to the embodiment shown in FIG. 4 in that a silicon microprocessor (10) is fixed between a substrate layer (12) and a first thermal interface material (TIM) layer (14). A lid (18) encases the silicon microprocessor (10), abutting the first TIM layer (14), and fixed to the top of the substrate layer (12). Applied to the top of the lid is a second TIM layer (16). FIG. 7 varies from FIG. 4 by illustrating configurable diamond pins (44) with multiple conduits (51). The bases (49) of the configurable diamond pins rest at the second TIM layer (16), while the conduits (51) traverse drilled holes of the lid to abut the first TIM layer (14). The shafts (54) of the configurable diamond pins are centrally located and fixed to heat pipes (37). The heat pipes (37) are centrally located, surrounded by and connected to a heat sink structure (43). As can be seen, one diamond pin structure can have multiple conduits to conduct heat away from multiple junction temperature hot spot locations. Additionally, the diamond pins can be inserted in a variety of configurations, wherein the base of a diamond pin can take on a variety of shapes.

Embodiments may include one or more of the following advantages. Namely, the short, small design of configurable diamond pins reduces costs as opposed to an expensive system only using diamond pins. Furthermore, the small configurable diamond pins are flexible in placement, when the placement of the heat sink structure may be rigid and fixed. The diamond pins efficiently transfer heat to the heat pipes, which having a high heat transfer rate, then fan out the heat across the fins of the heat sink structure. Embodiments shown provide cooling to the silicon microprocessor chip at specific locations and as a whole. Additionally, placing the diamond pins over the junction temperatures hot spot locations reduces junction temperature and ensures functionally at critical circuit blocks in the silicon microprocessor.

In one or more embodiments, passive elements are employed to ensure reliability in cooling the silicon microprocessor. Furthermore, embodiments provide a cost efficient and highly effective method of cooling a silicon microprocessor. Passive cooling allows for fewer fans or decreased fan speed, providing savings in cost, physical dimensions, and power consumption. The combination of the dual methodologies, heat pipe and diamond cooling, makes for a robust design. Traditional designs with only heat pipes or only diamond pins would make the cooling apparatus resultantly cumbersome or expensive respectively.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for cooling a microprocessor comprising:
    a first thermal interface material layer;
    a lid that encases the first thermal interface material layer and the microprocessor;
    a second thermal interface material layer applied to a top of the lid;
    at least one configurable diamond pin;
    at least one heat pipe; and
    a heat sink structure;
    wherein at least one diamond pin is configured to displace junction temperature on a hot spot location of the microprocessor; and
    wherein the heat sink structure and at least one heat pipe are configured atop the second thermal interface material layer.

2. The apparatus of claim 1, wherein said heat pipe comprises:
    a vacuum tight envelope;
    a wick structure; and
    a working fluid.

3. The apparatus of claim 1, wherein the heat sink structure comprises a plurality of heat sink fins.

4. The apparatus of claim 1, wherein said first and second thermal interface material layers are made from a composite thermal grease.

5. The apparatus of claim 1, wherein at least one diamond pin abuts the first thermal interface material, traverses a set of holes in said lid and second thermal interface material, and connects to a base of at least one heat pipe.

6. The apparatus of claim 1, wherein at least one heat pipe is configured longitudinally and is connected to the heat sink structure.

7. The apparatus of claim 1, wherein at least one diamond pin comprises:
    a base structure;
    a shaft connected to a top of the base; and
    at least one conduit that branches off from a bottom of said base.

8. A method of cooling a microprocessor comprising a first thermal interface material layer; a lid that encases the first thermal interface material layer and the microprocessor; a second thermal interface material layer applied to a top of the lid, the method comprising:
    disposing at least one configurable diamond pin at a hot spot location of the microprocessor; and
    configuring a heat sink structure and at least one heat pipe atop the second thermal interface material layer.

9. The method of claim 8, further comprising inserting at least one configurable diamond pin into a set of holes in the lid placed directly over or nearby junction temperature hot spots, and connecting at least one configurable diamond pin to the base of at least one heat pipe.

10. The method of claim 9, further comprising transferring heat from a silicon microprocessor to at least one configurable diamond pin through at least one heat pipe to a heat sink structure.

* * * * *